(12) United States Patent
Wen

(10) Patent No.: US 11,462,190 B2
(45) Date of Patent: Oct. 4, 2022

(54) CONTROL CIRCUIT, LIQUID CRYSTAL DISPLAY DRIVE MODULE, AND LIQUID CRYSTAL DISPLAY APPARATUS

(71) Applicant: VIVO MOBILE COMMUNICATION CO., LTD., Guangdong (CN)

(72) Inventor: Liang Wen, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 0 days.

(21) Appl. No.: 17/319,404

(22) Filed: May 13, 2021

(65) Prior Publication Data

US 2021/0264869 A1   Aug. 26, 2021

Related U.S. Application Data

(63) Continuation of application No. PCT/CN2019/116588, filed on Nov. 8, 2019.

(30) Foreign Application Priority Data

Nov. 14, 2018   (CN) .......................... 201811353013.1

(51) Int. Cl.
*G09G 3/36* (2006.01)

(52) U.S. Cl.
CPC ..... *G09G 3/3696* (2013.01); *G09G 2330/025* (2013.01)

(58) Field of Classification Search
CPC ........... G09G 3/3696; G09G 2330/025; G09G 2330/021; G09G 2330/02; G09G 2330/00; G09G 3/36
See application file for complete search history.

(56) References Cited

U.S. PATENT DOCUMENTS

| 2005/0017965 | A1* | 1/2005 | Morita | ................. G09G 3/3696 345/211 |
| 2007/0242170 | A1* | 10/2007 | Ogino | ...................... G09G 5/00 348/730 |
| 2007/0262655 | A1* | 11/2007 | Lin | ...................... G09G 3/3406 307/140 |

(Continued)

FOREIGN PATENT DOCUMENTS

| CN | 200983156 Y | 11/2007 |
| CN | 201017211 Y | 2/2008 |

(Continued)

OTHER PUBLICATIONS

EP Search Report in Application No. 19883779.1 dated Dec. 3, 2021.

(Continued)

*Primary Examiner* — Michael A Faragalla
*Assistant Examiner* — Sujit Shah
(74) *Attorney, Agent, or Firm* — Maschoff Brennan

(57) ABSTRACT

A control circuit, a liquid crystal display drive module, and a liquid crystal display apparatus are disclosed. The control circuit includes: a first input end (101) and a second input end (102) that separately receive different external power source signals, and the control circuit sequentially controls the first input end (101) and the second input end (102) to input a power source signal to the drive chip, and sequentially controls the second input end (102) and the first input end (101) to power off.

10 Claims, 5 Drawing Sheets

(56) References Cited

U.S. PATENT DOCUMENTS

| | | | |
|---|---|---|---|
| 2008/0148086 A1 | 6/2008 | Zhang | |
| 2008/0284770 A1* | 11/2008 | Kwak | G02F 1/13458 |
| | | | 345/87 |
| 2014/0062477 A1 | 3/2014 | Chen | |
| 2014/0168052 A1* | 6/2014 | Zhang | G09G 3/3406 |
| | | | 315/291 |
| 2015/0062618 A1 | 3/2015 | Saisho | |
| 2016/0078818 A1 | 3/2016 | Kang et al. | |
| 2018/0075815 A1 | 3/2018 | Chuang et al. | |
| 2018/0302043 A1* | 10/2018 | Liu | G09G 5/003 |

FOREIGN PATENT DOCUMENTS

| | | |
|---|---|---|
| CN | 201860306 U | 6/2011 |
| CN | 202076999 U | 12/2011 |
| CN | 104795038 A | 7/2015 |
| CN | 204539105 U | 8/2015 |
| CN | 107818767 A | 3/2018 |
| CN | 109192177 A | 1/2019 |
| JP | 2007065135 A | 3/2007 |
| KR | 20050034259 A | 4/2005 |
| TW | 201411583 A | 3/2014 |

OTHER PUBLICATIONS

CN Office Action in Application No. 201811353013.1 dated Dec. 27, 2019.
Written Opinion and International Search Report in Application No. PCT/CN2019/116588 dated May 27, 2021.

* cited by examiner

CONTROL CIRCUIT, LIQUID CRYSTAL DISPLAY DRIVE MODULE, AND LIQUID CRYSTAL DISPLAY APPARATUS

CROSS-REFERENCE OF RELATED APPLICATION

This application is a continuation application of a PCT Application No. PCT/CN2019/116588 filed on Nov. 8, 2019, which claims priority to Chinese Patent Application No. 201811353013.1, filed on Nov. 14, 2018 in China, which is incorporated herein by reference in its entirety.

TECHNICAL FIELD

The present disclosure relates to the field of communications technologies, and in particular, to a control circuit, a liquid crystal display drive module, and a liquid crystal display apparatus.

BACKGROUND

With the rapid development of liquid crystal display technologies, liquid crystal display apparatuses have been very common in people's lives, and have brought new visual experience to users. An external power supply of a drive chip of a liquid crystal display drive module mainly includes a VDDI signal, an AVDD signal, and an AVEE signal during power supply. Under normal circumstances, the VDDI signal is powered on earlier than the AVDD signal and the AVEE signal, and the VDDI signal is powered off later than the AVDD signal and the AVEE signal. The three work together to make the liquid crystal display drive module work normally.

However, under abnormal circumstances, the AVDD signal and the AVEE signal may be powered on earlier than the VDDI signal, or the AVDD signal and the AVEE signal may be powered off later than the VDDI signal, which has a high probability of causing damage to the drive chip.

SUMMARY

Some embodiments of the present disclosure provide a control circuit, a liquid crystal display drive module, and a liquid crystal display apparatus, to resolve the problem of a high probability of causing damage to the drive chip under abnormal circumstances.

To resolve the foregoing technical problem, the present disclosure is implemented as follows:

According to a first aspect, some embodiments of the present disclosure provide a control circuit, configured to control an on/off time sequence of multiple power source signals inputted to a drive chip of a display module, where the control circuit includes a first input end and a second input end that separately receive different external power source signals, and the control circuit sequentially controls the first input end and the second input end to input a power source signal to the drive chip, and sequentially controls the second input end and the first input end to power off.

According to a second aspect, some embodiments of the present disclosure further provide a liquid crystal display drive module, including a drive chip, where the liquid crystal display drive module further includes the foregoing control circuit.

According to a third aspect, some embodiments of the present disclosure further provide a liquid crystal display apparatus, including the foregoing liquid crystal display drive module.

A control circuit in some embodiments of the present disclosure is configured to control an on/off time sequence of multiple power source signals inputted to a drive chip of a display module, where the control circuit includes a first input end and a second input end that separately receive different external power source signals, and the control circuit sequentially controls the first input end and the second input end to input a power source signal to the drive chip, and sequentially controls the second input end and the first input end to power off. In this way, by controlling the time sequence between different power source signals, the normal time sequence between different power source signals can be ensured as much as possible, to reduce the probability of damaging the drive chip.

BRIEF DESCRIPTION OF DRAWINGS

To describe the technical solutions in some embodiments of the present disclosure more clearly, the following briefly describes the accompanying drawings required for describing some embodiments of the present disclosures. Apparently, the accompanying drawings in the following description show merely some embodiments of the present disclosure, and a person of ordinary skill in the art may still derive other drawings from these accompanying drawings without creative efforts.

DETAILED DESCRIPTION OF EMBODIMENTS

The following clearly and completely describes the technical solutions in some embodiments of the present disclosure with reference to the accompanying drawings in some embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 1:
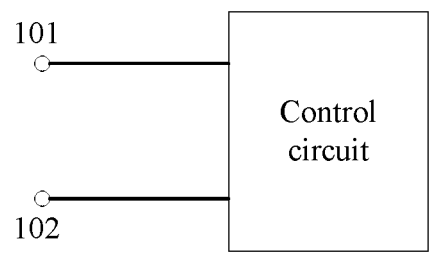
FIG. 1 is a first schematic structural diagram of a control circuit according to some embodiments of the present disclosure.

Referring to FIG. 1, FIG. 1 is a schematic structural diagram of a control circuit according to some embodiments of the present disclosure. The control circuit is configured to control an on/off time sequence of multiple external power source signals inputted to a drive chip of a display module. As shown in FIG. 1, the control circuit includes a first input end 101 and a second input end 102 that separately receive different external power source signals, and the control circuit sequentially controls the first input end 101 and the second input end 102 to input a power source signal to the drive chip, and sequentially controls the second input end 102 and the first input end 101 to power off.

In the embodiments, the first input end 101 may be a VDDI input end, and the second input end 102 may be an AVDD input end or an AVEE input end. In this way, the VDDI signal can be inputted to the drive chip earlier than the AVDD signal or the AVEE signal, and the AVDD signal or the AVEE signal can be powered off earlier than the VDDI signal. The control circuit includes a capacitor, which sequentially controls the second input end and the first input end to power off.

In this way, by controlling the time sequence between different power source signals, the normal time sequence between different power source signals can be ensured as much as possible, to reduce the probability of damaging the drive chip.

Optionally, the second input end includes a second input sub-end and a third input sub-end, the second input sub-end and the third input sub-end separately receive different external power source signals, and the control circuit sequentially controls the first input end, the second input sub-end, and the third input sub-end to input a power source signal to the drive chip, and sequentially controls the third input sub-end, the second input sub-end, and the first input end to power off.

In this implementation, the second input end includes the second input sub-end and the third input sub-end, the second input sub-end and the third input sub-end separately receive different external power source signals, and the control circuit sequentially controls the first input end, the second input sub-end, and the third input sub-end to input a power source signal to the drive chip, and sequentially controls the third input sub-end, the second input sub-end, and the first input end to power off. In this way, the normal time sequence of multiple different power source signals can be ensured, to reduce the probability of damaging the drive chip.

Optionally, the first input end is a VDDI input end, the second input sub-end is an AVEE input end, and the third input sub-end is an AVDD input end.

Alternatively, the first input end is a VDDI input end, the second input sub-end is an AVDD input end, and the third input sub-end is an AVEE input end.

In this embodiment, when the first input end is a VDDI input end, the second input sub-end is an AVEE input end, and the third input sub-end is an AVDD input end, it can be ensured that the VDDI signal, the AVEE signal, and the AVDD signal are sequentially inputted to the drive chip, and the AVDD signal, the AVEE signal, and the VDDI signal can be sequentially powered off at the drive chip end.

In this embodiment, when the first input end is the VDDI input end, the second input sub-end is the AVDD input end, and the third input sub-end is the AVEE input end, it can be ensured that the VDDI signal, the AVDD signal, and the AVEE signal are sequentially inputted to the drive chip, and the AVEE signal, the AVDD signal, and the VDDI signal can be sequentially powered off at the drive chip end.

In this way, the normal time sequence of the AVDD signal, the AVEE signal, and the VDDI signal is controlled, to reduce the probability of damaging the drive chip caused by a latch high current inside.

Optionally, the first input end is a VDDI input end, the second input sub-end is an AVEE input end, the third input sub-end is an AVDD input end, and the control circuit includes:

a first resistor R1, where a first end of the first resistor R1 is connected to the VDDI input end;

an N-type field effect transistor M1, where a gate electrode of the N-type field effect transistor M1 is connected to a second end of the first resistor R1, a first electrode of the N-type field effect transistor M1 is connected to the AVEE input end, and a second electrode of the N-type field effect transistor M1 is connected to the drive chip;

a first capacitor C1, where a first end of the first capacitor C1 is connected to the second end of the first resistor R1, and a second end of the first capacitor C1 is grounded, or a second end of the first capacitor C1 is connected to the second electrode of the N-type field effect transistor M1;

a second resistor R2, where a first end of the second resistor R2 is connected to the second electrode of the N-type field effect transistor M1;

a P-type field effect transistor M2, where a gate electrode of the P-type field effect transistor M2 is connected to the second end of the second resistor R2, a first electrode of the P-type field effect transistor M2 is connected to the AVDD input end, and a second electrode of the P-type field effect transistor M2 is connected to the drive chip; and a second capacitor C2, where a first end of the second capacitor C2 is connected to the second end of the second resistor R2, and a second end of the second capacitor C2 is grounded, or a second end of the second capacitor C2 is connected to the second electrode of the P-type field effect transistor M2.

Figure 2:
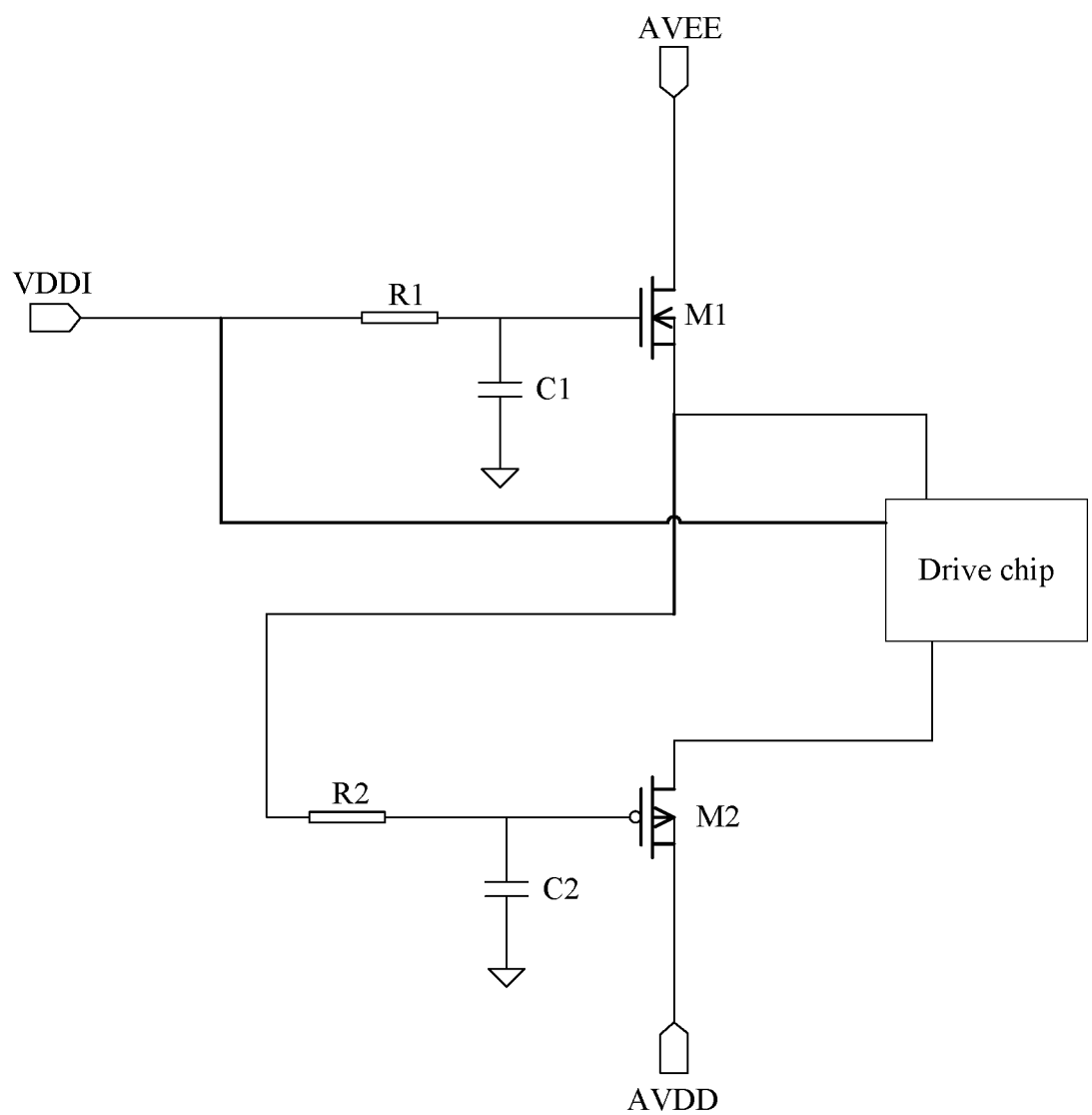
FIG. 2 is a second schematic structural diagram of a control circuit according to some embodiments of the present disclosure.
Figure 3:
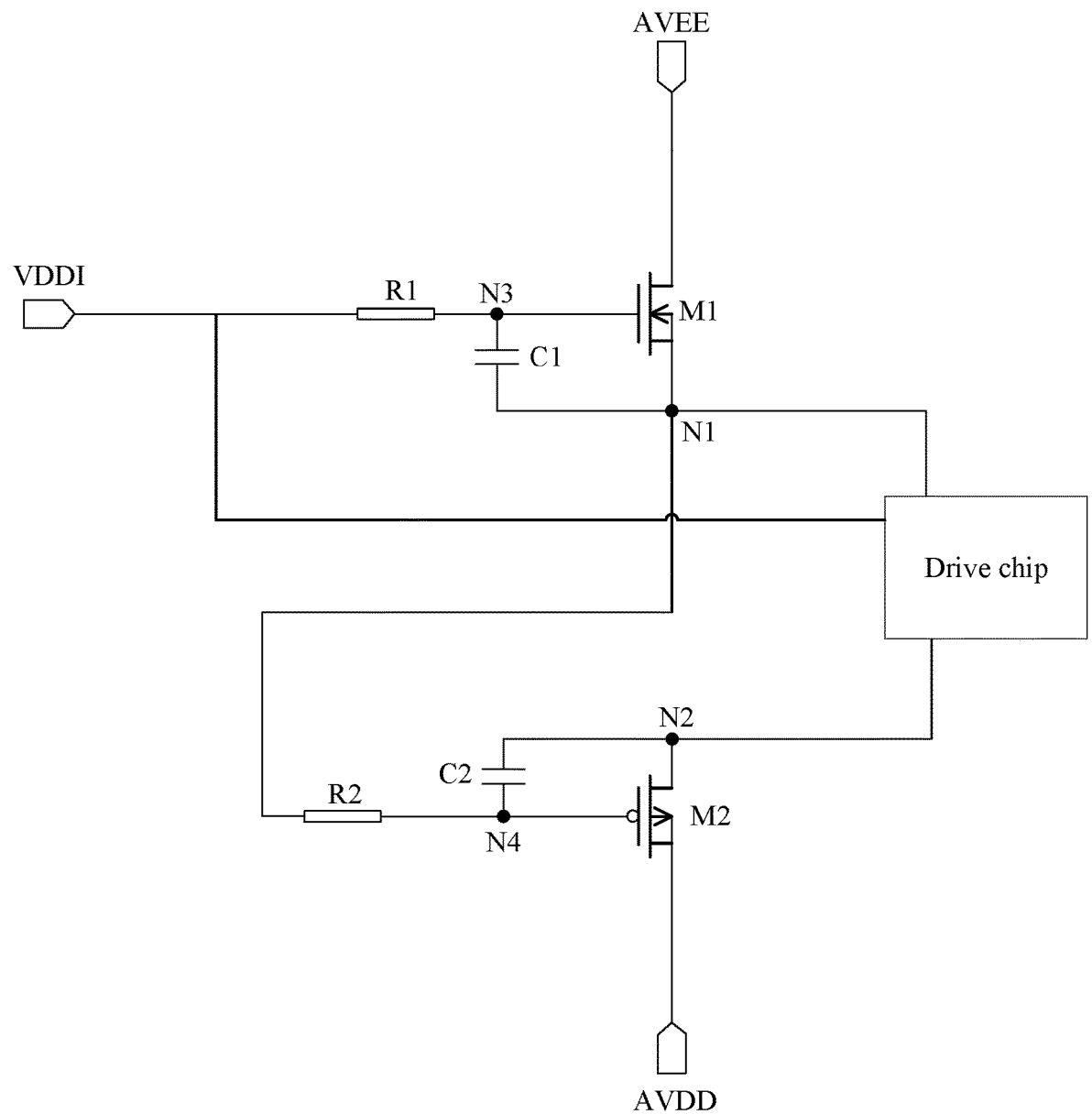
FIG. 3 is a third schematic structural diagram of a control circuit according to some embodiments of the present disclosure.

In this implementation, the position of the second electrode of the N-type field effect transistor M1 that is connected to the drive chip is different from the position of the second electrode of the P-type field effect transistor M2 that is connected to the drive chip. The first electrode and the second electrode of the N-type field effect transistor M1 or the P-type field effect transistor M2 can be the source electrode and the drain electrode respectively, or can be the drain electrode and the source electrode respectively. For better understanding of the foregoing circuit, refer to FIG. 2 and FIG. 3. FIG. 2 and FIG. 3 are both schematic structural diagrams of control circuits according to some embodiments of the present disclosure.

First, refer to FIG. 2. In this case, the second end of the first capacitor C1 is grounded, and the second end of the second capacitor C2 is grounded. The VDDI signal is used as a gate control signal of the N-type field effect transistor M1. When the VDDI voltage reaches, for example, 1.8V, the VDDI signal first charges the first capacitor C1 through the first resistor R1. After the first capacitor C1 is charged for a certain period of time and reaches the power-on voltage of the N-type field effect transistor M1, the AVEE signal starts to input through the N-type field effect transistor M1. The inputted AVEE signal is divided into multiple channels. One channel of inputted AVEE signal enters the boost circuit of the drive chip. Another channel of inputted AVEE signal charges the second capacitor C2 through the second resistor R2. When the second capacitor C2 is charged for a certain period of time and reaches the power-on voltage of the P-type field effect transistor M2, the AVDD signal is inputted through the P-type field effect transistor M2. Therefore, even if the external power supply is abnormal and the AVDD signal or the AVEE signal supplies power earlier than the VDDI signal, the AVDD signal or the AVEE signal cannot be inputted into the drive chip earlier than the VDDI signal.

For example, the voltage of the VDDI signal is 1.8V, the first resistor R1 is 10K ohm, and the first capacitor C1 is 4.7 µF. The voltage of the AVEE signal is −5.5V, the second resistor R2 is 1K ohm, and the second capacitor C2 is 1 µF. If an abnormal power-on scenario in which the AVDD signal is powered on first, the AVEE signal is powered on next, and the VDDI signal is powered on last occurs, because neither the N-type field effect transistor M1 nor the P-type field effect transistor M2 is connected, the potential of the first capacitor C1 rises only when the VDDI signal is powered on. A few milliseconds later, the N-type field effect transistor M1 is turned on, the AVEE signal is powered on, then the second capacitor C2 is charged, and the AVDD signal is powered on for input. In this way, the VDDI signal is first inputted among the three channels of power supply, so that the drive chip works normally. After the VDDI signal is inputted for a period of time, the AVEE signal is inputted. After the AVEE signal is inputted for a period of time, the AVDD signal is inputted, so that the boost circuit of the drive chip works under the drive of the AVEE signal and the AVDD signal.

When a host is shut down or the power supply of a host is abnormally powered off or the like, the first capacitor C1 and the second capacitor C2 are fully charged in a power-on state. When the power supply of the VDDI, the AVDD, and the AVEE is disconnected, the AVDD signal exists because of another capacitor and a parasitic capacitor. After the capacitor discharges for a period of time, there is no input and power-off occurs. Because the first capacitor C1 and the second capacitor C2 store more power, they continue to input power for a longer period of time. Moreover, R1C1 can be set to be greater than R2C2 to ensure that the continuous input time of the VDDI signal is longer than the continuous input time of the AVEE signal. Thus, the expected state in which the AVDD signal is powered off first, the AVEE signal is powered off next, and the VDDI signal is powered off last can be achieved. In this way, when power supply of the host is powered off, under the control of the circuit, the AVDD signal is turned off first, then the AVEE signal is turned off, and finally the VDDI signal is turned off.

In the circuit structure shown in FIG. 2, no matter how the external voltage abnormally provides power supply and abnormally powers off, the circuit is disposed, so that power supply can be provided according to a required power supply sequence that is set or power-off is implemented according to a desired sequence.

Still referring to FIG. 3, a second end of the first capacitor C1 is connected to the second electrode of the N-type field effect transistor M1, and a second end of the second capacitor C2 is connected to the second electrode of the P-type field effect transistor M2. When the VDDI signal charges the first capacitor C1 and turns on the N-type field effect transistor M1, the AVEE signal (generally −5.5V) is inputted to the node N1, which increases the voltage difference between the node N3 and the node N1 and accelerates the charging speed of the first capacitor C1. At the same time, the voltage differences between the gate electrode and the source electrode and between the gate electrode and the drain electrode of the N-type field effect transistor M1 increase, so that the speed at which the current of the AVEE signal passes through the N-type field effect transistor M1 is faster, that is, the speed at which the AVEE signal reaches a preset value −5.5V from 0V is faster. Similarly, the voltage difference between the node N4 and the node N2 increases rapidly, which improves the power-on speed of the AVDD signal. The AVDD signal and the AVEE signal power on rapidly to reach the predetermined voltage, which can reduce the probability that the boost circuit of the drive chip has logic confusion and consequently a latch high current burns the drive chip. Therefore, the power-on process of power supply of the boost circuit is optimized.

Optionally, the first input end is a VDDI input end, the second input sub-end is an AVDD input end, the third input sub-end is an AVEE input end, and the control circuit includes:

a third resistor R3, where a first end of the third resistor R3 is connected to the VDDI input end;

a first N-type field effect transistor M3, where a gate electrode of the first N-type field effect transistor M3 is connected to a second end of the third resistor R3, a first electrode of the first N-type field effect transistor M3 is connected to the AVDD input end, and a second electrode of the first N-type field effect transistor M3 is connected to the drive chip;

a third capacitor C3, where a first end of the third capacitor C3 is connected to the second end of the third resistor R3, and a second end of the third capacitor C3 is grounded, or a second end of the third capacitor C3 is connected to the second electrode of the first N-type field effect transistor M3;

a fourth resistor R4, where a first end of the fourth resistor R4 is connected to the second electrode of the first N-type field effect transistor M3;

a second N-type field effect transistor M4, where a gate electrode of the second N-type field effect transistor M4 is connected to a second end of the fourth resistor R4, a first electrode of the second N-type field effect transistor M4 is connected to the AVEE input end, and a second electrode of the second N-type field effect transistor M4 is connected to the drive chip; and a fourth capacitor C4, where a first end of the fourth capacitor C4 is connected to the second end of the fourth resistor R4, and a second end of the fourth capacitor C4 is grounded, or a second end of the fourth capacitor C4 is connected to the second electrode of the second N-type field effect transistor M4.

In this implementation, the position of the second electrode of the first N-type field effect transistor M3 that is connected to the drive chip is different from the position of the second electrode of the second N-type field effect transistor M4 that is connected to the drive chip. The first electrode and the second electrode of the first N-type field effect transistor M3 or the second N-type field effect transistor M4 can be the source electrode and the drain electrode respectively, or can be the drain electrode and the source electrode respectively. For better understanding of the foregoing circuit, referring to FIG. 4, FIG. 4 is a schematic structural diagram of a control circuit according to some embodiments of the present disclosure.

Figure 4:
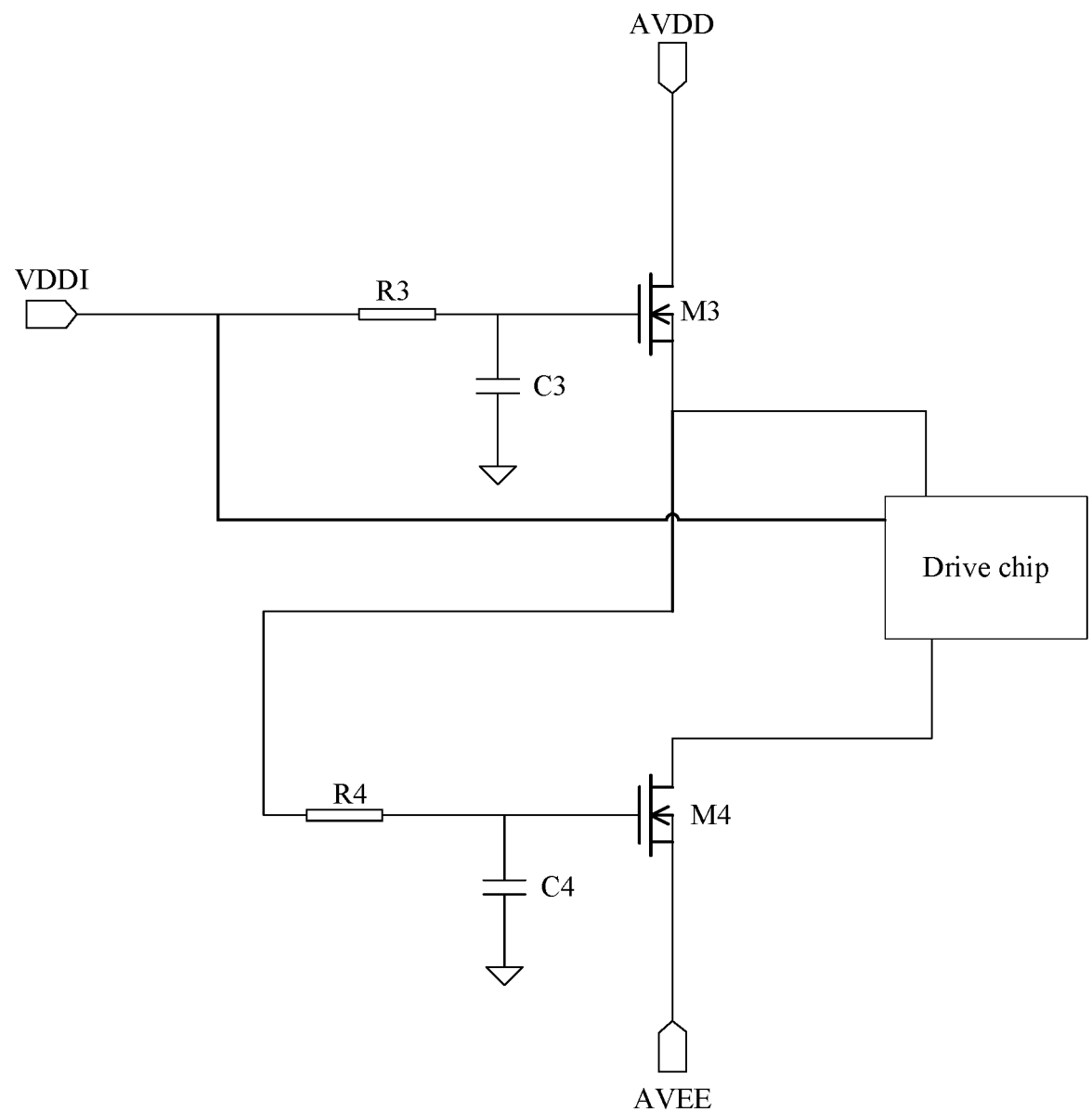
FIG. 4 is a fourth schematic structural diagram of a control circuit according to some embodiments of the present disclosure.

As shown in FIG. 4, in this case, the second end of the third capacitor C3 is grounded, and the second end of the fourth capacitor C4 is grounded. After the VDDI signal is powered on, the VDDI signal charges the third capacitor C3. Generally, when the third capacitor C3 reaches about 0.3V, the third capacitor C3 may start to reach the threshold voltage to turn on the first N-type field effect transistor M3. After the voltage of the third capacitor C3 continues to increase, the first N-type field effect transistor M3 is turned on. The AVDD signal is inputted through the first N-type field effect transistor M3. One channel of the AVDD signal enters the boost circuit of the drive chip, and the other channel of the AVDD signal charges the fourth capacitor C4 through the fourth resistor R4. As the voltage of the fourth capacitor C4 increases, the second N-type field effect transistor M4 is turned on, and the AVEE signal can be inputted into the drive chip. This ensures a power-on sequence in which the VDDI signal is powered on first, then the AVDD signal is powered on, and finally the AVEE signal is powered on.

Optionally, the control circuit includes:

a selecting circuit;

a third N-type field effect transistor M5, where the VDDI input end is connected to the gate electrode of the third N-type field effect transistor M5 through the selecting circuit, the first electrode of the third N-type field effect transistor M5 is connected to the AVDD input end, and the second electrode of the third N-type field effect transistor M5 is connected to the drive chip; and a fourth N-type field effect transistor M6, where the VDDI input end is connected to the gate electrode of the fourth N-type field effect transistor M6 through the selecting circuit, the first electrode of the fourth N-type field effect transistor M6 is connected to the AVEE input end, and the second electrode of the fourth N-type field effect transistor M6 is connected to the drive chip, where the selecting circuit is configured to: sequentially select a first target field effect transistor and a second target field effect transistor from the third N-type field effect transistor M5 and the fourth N-type field effect transistor M6, and sequentially delay turning on of source electrodes and drain electrodes of the first target field effect transistor and the second target field effect transistor.

In this implementation, the position of the second electrode of the third N-type field effect transistor M5 that is connected to the drive chip is different from the position of the second electrode of the fourth N-type field effect transistor M6 that is connected to the drive chip. The first electrode and the second electrode of the third N-type field effect transistor M5 or the fourth N-type field effect transistor M6 can be the source electrode and the drain electrode respectively, or can be the drain electrode and the source electrode respectively. When the first target field effect transistor is the third N-type field effect transistor M5, the second target field effect transistor is the fourth N-type field effect transistor M6. When the first target field effect transistor is the fourth N-type field effect transistor M6, the second target field effect transistor is the third N-type field effect transistor M5.

In this embodiment, the selecting circuit can include different capacitors to control power-on and power-off time sequences of the AVDD signal and the AVEE signal. When the AVEE signal is inputted to the drive chip earlier than the AVDD signal, the second input sub-end is an AVEE input end, and the third input sub-end is an AVDD input end. When the AVDD signal is inputted to the drive chip earlier than the AVEE signal, the second input sub-end is an AVDD input end, and the third input sub-end is an AVEE input end. Certainly, a specific manner may be set for the selecting circuit according to an actual requirement, which is not limited in this implementation.

Figure 5:
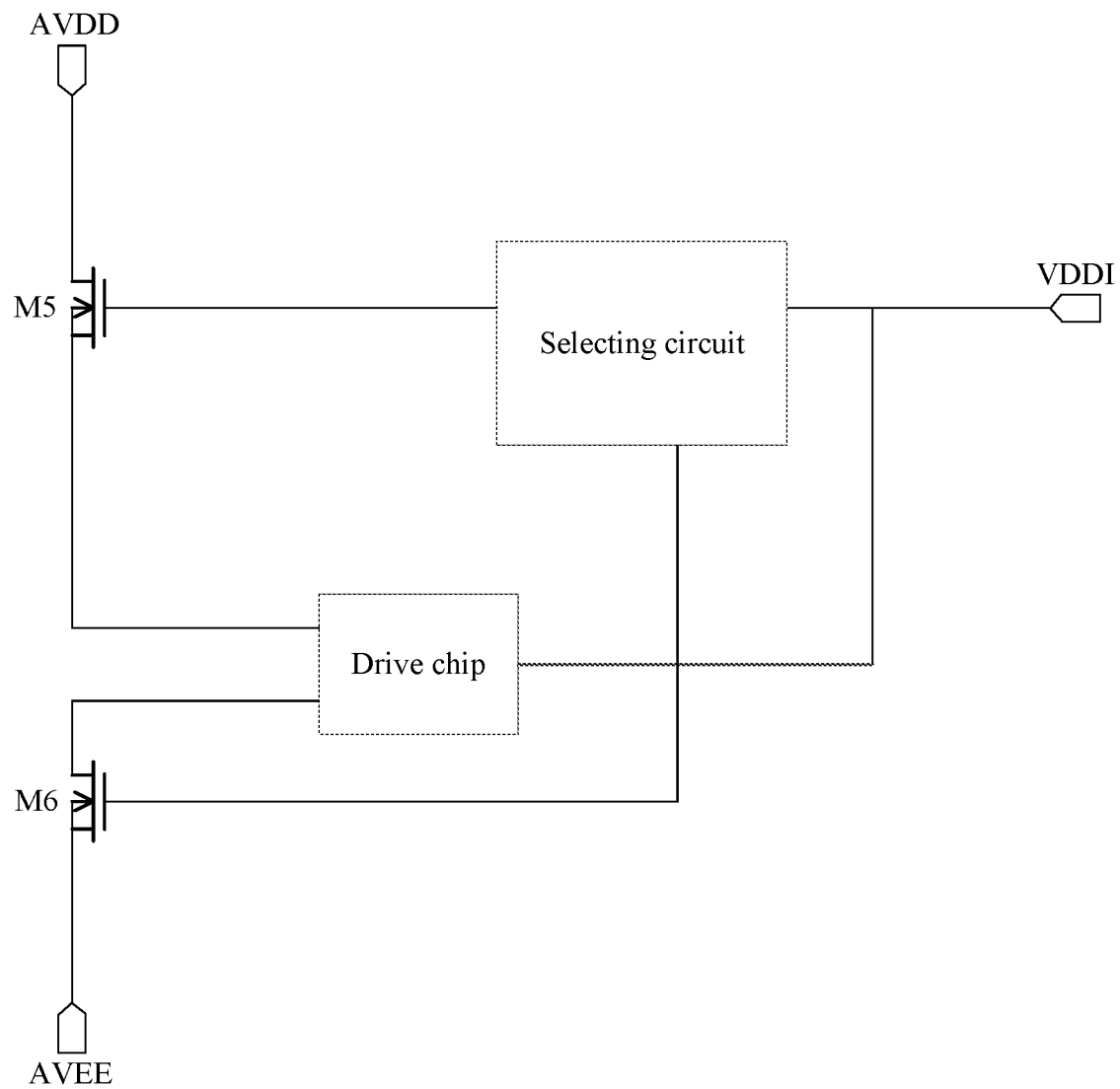
FIG. 5 is a fifth schematic structural diagram of a control circuit according to some embodiments of the present disclosure.

For better understanding of the foregoing circuit, referring to FIG. 5, FIG. 5 is a schematic structural diagram of a control circuit according to some embodiments of the present disclosure.

As shown in FIG. 5, when the VDDI signal is inputted, after the selecting circuit works, the drive signal is outputted. In the preset sequence, the third N-type field effect transistor M5 and the fourth N-type field effect transistor M6 are turned on successively to control the AVDD signal to be inputted first and the AVEE signal to be inputted next. This can be fixed in the drive chip by programming in advance. Alternatively, when the drive chip works after the VDDI signal is powered on, the drive chip can be programmed to determine the power-on sequence of the AVDD signal and the AVEE signal, and the selecting circuit outputs the control signal in a corresponding sequence. In this way, the input of the AVDD signal and the AVEE signal can be controlled flexibly by programming.

Optionally, a thermosensitive resistor is connected on the paths of the AVEE input end and the drive chip in series.

and/or a thermosensitive resistor is connected on the paths of the AVDD input end and the drive chip in series.

In this implementation, the thermosensitive resistor is connected in series. When the boost circuit of the drive chip has a latch large current, the increase of the current causes the thermosensitive resistor to heat and increase in resistance, which reduces the current that flows, thus protecting the drive chip.

Figure 6:
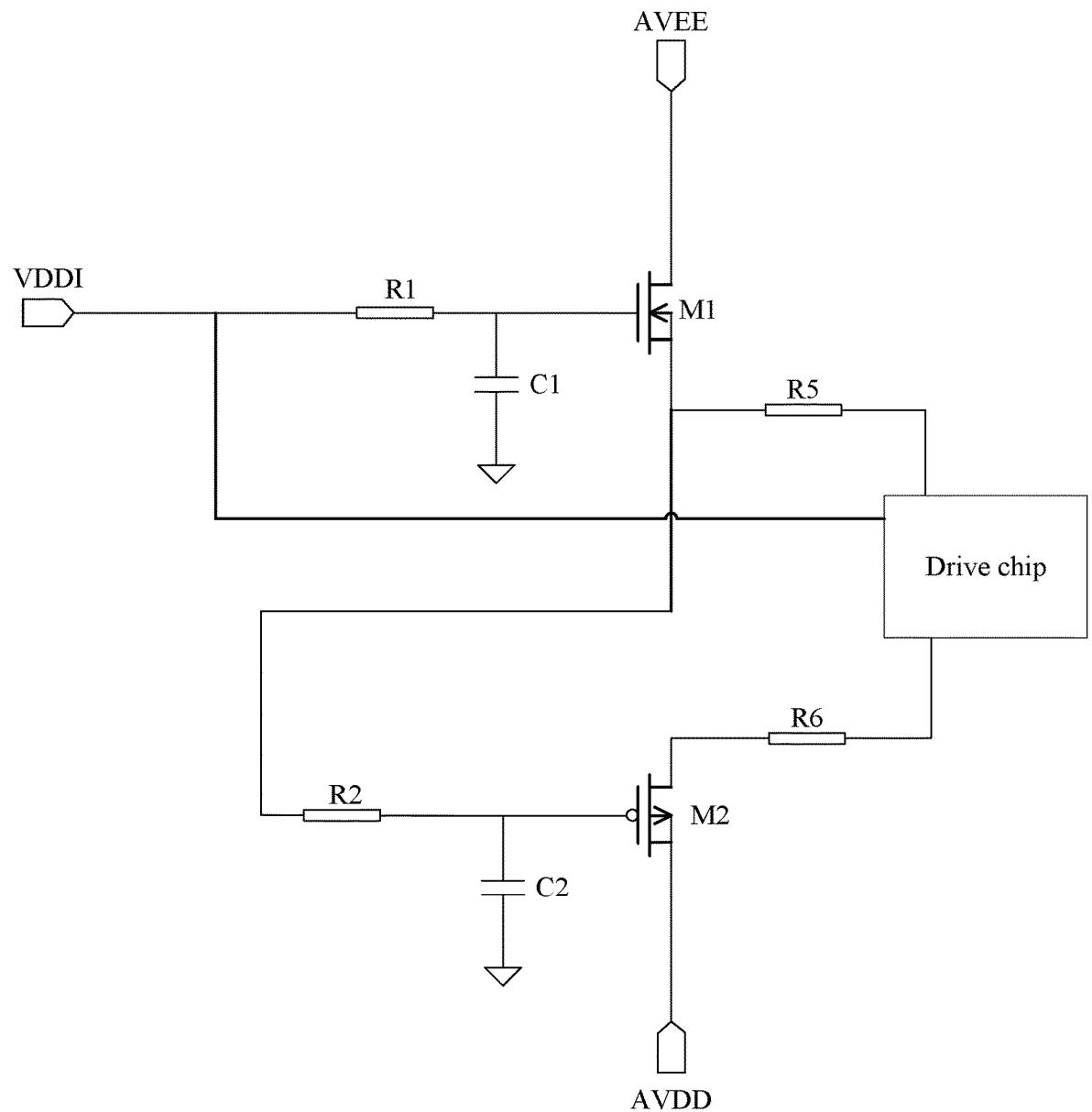
FIG. 6 is a sixth schematic structural diagram of a control circuit according to some embodiments of the present disclosure.

For better understanding of the foregoing circuit structure, referring to FIG. 6, FIG. 6 is a schematic structural diagram of a control circuit according to some embodiments of the present disclosure. As shown in FIG. 6, a thermosensitive resistor R5 is connected on the paths of the AVEE input end and the drive chip in series, and a thermosensitive resistor R6 is connected on the paths of the AVDD input end and the drive chip in series. When the drive chip starts to work and the AVEE signal and the AVDD signal extract large currents, particularly, when the boost circuit of the drive chip has a latch large current, the increase of the current causes the thermosensitive resistor to heat and increase in resistance, which reduces the current that flows through the thermosensitive resistor, thus protecting the drive chip.

It should be noted that in the circuit in the embodiments, in addition to the transistor, a thyristor may also be used to control the current of power supply. Moreover, the resistor, the thermosensive resistor, and the capacitor in the circuit can be disposed on an external circuit board or integrated into the drive chip. Multiple optional implementations introduced in some embodiments of the present disclosure may be implemented in combination with each other or implemented separately, which is not limited in some embodiments of the present disclosure.

A control circuit in some embodiments of the present disclosure is configured to control an on/off time sequence of multiple power source signals inputted to a drive chip of a display module, where the control circuit includes a first input end 101 and a second input end 102 that separately receive different external power source signals, and the control circuit sequentially controls the first input end 101 and the second input end 102 to input a power source signal to the drive chip, and sequentially controls the second input end 102 and the first input end 101 to power off. In this way, by controlling the time sequence between different power source signals, the normal time sequence between different power source signals can be ensured as much as possible, to reduce the probability of damaging the drive chip.

Some embodiments of the present disclosure further provide a liquid crystal display drive module, including a drive chip, where the liquid crystal display drive module further includes the foregoing control circuit.

Some embodiments of the present disclosure further provide a liquid crystal display apparatus, including the foregoing liquid crystal display drive module.

In some embodiments of the present disclosure, the liquid crystal display apparatus may be a mobile phone, a tablet personal computer (Tablet Personal Computer), a laptop computer (Laptop Computer), a personal digital assistant (Personal Digital Assistant, PDA), a mobile internet device (Mobile Internet Device, MID), a wearable device (Wearable Device), or the like.

It should be noted that, in this specification, the terms "include", "comprise", or any of their variants are intended to cover a non-exclusive inclusion, so that a process, a method, an article, or an apparatus that includes a list of elements not only includes those elements but also includes other elements that are not expressly listed, or further includes elements inherent to such a process, method, article, or apparatus. An element limited by "includes a . . . " does not, without more constraints, preclude the presence of additional identical elements in the process, method, article, or apparatus that includes the element.

The embodiments of the present disclosure are described above with reference to the accompanying drawings, but the present disclosure is not limited to the foregoing specific implementations. The foregoing specific implementations are merely schematic instead of restrictive. Under enlightenment of the present disclosure, a person of ordinary skills in the art may make many forms without departing from the aims of the present disclosure and the protection scope of claims, all of which fall within the protection of the present disclosure.

The invention claimed is:

1. A control circuit, configured to control an on/off time sequence of multiple power source signals inputted to a drive chip of a display module, wherein the control circuit comprises a first input end and a second input end that separately receive different external power source signals, and the control circuit sequentially controls the first input end and the second input end to input a power source signal to the drive chip, and sequentially controls the second input end and the first input end to power off;
wherein the second input end comprises a second input sub-end and a third input sub-end, the second input sub-end and the third input sub-end separately receive different external power source signals, and the control circuit sequentially controls the first input end, the second input sub-end, and the third input sub-end to input a power source signal to the drive chip, and sequentially controls the third input sub-end, the second input sub-end, and the first input end to power off;
wherein the first input end is a VDDI input end, the second input sub-end is an AVEE input end, the third input sub-end is an AVDD input end, and the control circuit comprises:
a first resistor, wherein a first end of the first resistor is connected to the VDDI input end;
an N-type field effect transistor, wherein a gate electrode of the N-type field effect transistor is connected to a second end of the first resistor, a first electrode of the N-type field effect transistor is connected to the AVEE input end, and a second electrode of the N-type field effect transistor is connected to the drive chip;
a first capacitor, wherein a first end of the first capacitor is connected to the second end of the first resistor, and a second end of the first capacitor is grounded, or a second end of the first capacitor is connected to the second electrode of the N-type field effect transistor;
a second resistor, wherein a first end of the second resistor is connected to the second electrode of the N-type field effect transistor;
a P-type field effect transistor, wherein a gate electrode of the P-type field effect transistor is connected to the second end of the second resistor, a first electrode of the P-type field effect transistor is connected to the AVDD input end, and a second electrode of the P-type field effect transistor is connected to the drive chip; and
a second capacitor, wherein a first end of the second capacitor is connected to the second end of the second resistor, and a second end of the second capacitor is grounded, or a second end of the second capacitor is connected to the second electrode of the P-type field effect transistor;
or,
wherein the first input end is a VDDI input end, the second input sub-end is an AVDD input end, the third input sub-end is an AVEE input end, and the control circuit comprises:
a third resistor, wherein a first end of the third resistor is connected to the VDDI input end;
a first N-type field effect transistor, wherein a gate electrode of the first N-type field effect transistor is connected to a second end of the third resistor, a first electrode of the first N-type field effect transistor is connected to the AVDD input end, and a second electrode of the first N-type field effect transistor is connected to the drive chip;
a third capacitor, wherein a first end of the third capacitor is connected to the second end of the third resistor, and a second end of the third capacitor is grounded, or a second end of the third capacitor is connected to the second electrode of the first N-type field effect transistor;
a fourth resistor, wherein a first end of the fourth resistor is connected to the second electrode of the first N-type field effect transistor;
a second N-type field effect transistor, wherein a gate electrode of the second N-type field effect transistor is connected to a second end of the fourth resistor, a first electrode of the second N-type field effect transistor is connected to the AVEE input end, and a second electrode of the second N-type field effect transistor is connected to the drive chip; and
a fourth capacitor, wherein a first end of the fourth capacitor is connected to the second end of the fourth resistor, and a second end of the fourth capacitor is grounded, or a second end of the fourth capacitor is connected to the second electrode of the second N-type field effect transistor.

2. The control circuit according to claim 1, further comprising:
a selecting circuit;
a third N-type field effect transistor, wherein the VDDI input end is connected to the gate electrode of the third N-type field effect transistor through the selecting circuit, the first electrode of the third N-type field effect transistor is connected to the AVDD input end, and the second electrode of the third N-type field effect transistor is connected to the drive chip; and
a fourth N-type field effect transistor, wherein the VDDI input end is connected to the gate electrode of the fourth N-type field effect transistor through the selecting circuit, the first electrode of the fourth N-type field effect transistor is connected to the AVEE input end, and the second electrode of the fourth N-type field effect transistor is connected to the drive chip, wherein
the selecting circuit is configured to: sequentially select a first target field effect transistor and a second target field effect transistor from the third N-type field effect transistor and the fourth N-type field effect transistor, and sequentially delay turning on of source electrodes and drain electrodes of the first target field effect transistor and the second target field effect transistor.

3. The control circuit according to claim 2, wherein a thermosensitive resistor is connected on the paths of the AVEE input end and the drive chip in series;
and/or a thermosensitive resistor is connected on the paths of the AVDD input end and the drive chip in series.

4. A liquid crystal display drive module, comprising a drive chip, wherein the liquid crystal display drive module further comprises the control circuit according to claim 2.

5. The control circuit according to claim 1, wherein a thermosensitive resistor is connected on the paths of the AVEE input end and the drive chip in series;
and/or a thermosensitive resistor is connected on the paths of the AVDD input end and the drive chip in series.

6. A liquid crystal display drive module, comprising a drive chip, wherein the liquid crystal display drive module further comprises the control circuit according to claim 5.

7. A liquid crystal display drive module, comprising a drive chip, wherein the liquid crystal display drive module further comprises the control circuit according to claim 1.

8. A liquid crystal display apparatus, comprising the liquid crystal display drive module according to claim 7.

9. The control circuit according to claim 1, wherein a thermosensitive resistor is connected on the paths of the AVEE input end and the drive chip in series;
and/or a thermosensitive resistor is connected on the paths of the AVDD input end and the drive chip in series.

10. The control circuit according to claim 1, wherein a thermosensitive resistor is connected on the paths of the AVEE input end and the drive chip in series;
and/or a thermosensitive resistor is connected on the paths of the AVDD input end and the drive chip in series.

* * * * *